US 6,324,109 B1

(12) United States Patent
Inoue

(10) Patent No.: US 6,324,109 B1
(45) Date of Patent: Nov. 27, 2001

(54) SEMICONDUCTOR STORAGE DEVICE CAPABLE OF INCREASING ACCESS TIME SPEED

(75) Inventor: Kouji Inoue, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/605,975

(22) Filed: Jun. 29, 2000

(30) Foreign Application Priority Data

Jul. 2, 1999 (JP) ................................................... 11-189011

(51) Int. Cl.[7] ........................................................ G11C 7/00
(52) U.S. Cl. ............................................................. 365/203
(58) Field of Search .................................... 365/203, 204, 365/207, 189.09

(56) References Cited

U.S. PATENT DOCUMENTS

| 5,650,959 | * | 7/1997 | Hayashi et al. | 365/182 |
| 5,689,470 | * | 11/1997 | Inoue | 365/203 |
| 5,886,937 | * | 3/1999 | Jang | 365/203 |
| 6,088,277 | * | 7/2000 | Kim et al. | 365/207 |

FOREIGN PATENT DOCUMENTS 6-139787    5/1994    (JP) .

* cited by examiner

*Primary Examiner*—Richard Elms
*Assistant Examiner*—Anh Phung
(74) *Attorney, Agent, or Firm*—Morrison & Foerster LLP

(57) ABSTRACT

When starting a power, the precharge potential is supplied to all the bit lines and virtual GND lines by VREF potential supply circuits. In a read operation, after the end of a period during which the bit lines of the selected memory block are sensed by memory cells, the precharge potential is immediately supplied to the bit lines and the virtual GND lines, which have been selected, by the VREF potential supply circuits. By this operation, the precharge potential of all the bit lines and the virtual GND lines is maintained prior to the read operation. With this arrangement, a semiconductor storage device capable of increasing the access time speed without bit line division is provided.

8 Claims, 17 Drawing Sheets

PRIOR ART
Fig.19A  CLK 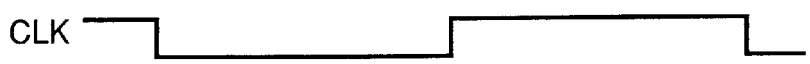
Fig.19B  /PR 
Fig.19C  WD 
Fig.19D  WL 
Fig.19E  BL 
Fig.19F  DBL 
Fig.19G  DE 
Fig.19H  Dout 

SEMICONDUCTOR STORAGE DEVICE CAPABLE OF INCREASING ACCESS TIME SPEED

BACKGROUND OF THE INVENTION

The present invention relates to semiconductor storage devices such as a normal mask ROM and a page mode mask ROM.

Conventionally, as a semiconductor storage device, there has been a general-purpose normal mask ROM that operates in accordance with the control timing shown in FIGS. 17A through 17I. As shown in FIGS. 17A through 17I, this normal mask ROM executes precharging (shown in FIG. 17C) of the desired bit line and virtual GND line decoded by a column address simultaneously with the turn on of the word line (shown in FIG. 17B) after the input of a row address and a column address. If an equalizing operation of the bit line and the reference line is required and a lot of memory cells are connected to one bit line, then the precharge operation and the equalizing operation of the bit line and the virtual GND line are executed taking a time being about two times the word line turn on time. After the completion of the precharge operation and the equalizing operation, a bit line sensing operation is executed by the memory cell. This bit line sensing operation means a bit line drawing operation for drawing in the potential of the bit line by the memory cell. The potential of the bit line is lowered in the case where the transistor of the memory cell is on (referred to as an ON-state transistor hereinafter), and the precharge potential of the bit line is maintained in the case where the transistor of the memory cell is off (referred to as an OFF-state transistor hereinafter) (shown in FIGS. 17E and 17H). Next, a potential difference between the bit line and the reference line, generated through this bit line sensing operation of the memory cell, is amplified by a sense amplifier (not shown), and the resulting data is outputted via an output buffer (not shown).

As described above, in the case of the normal mask ROM having a random access function, the row address and the column address are simultaneously inputted so as to execute parallel the turn on of the desired word line and the precharge operation and the equalizing operation of the desired bit line.

There is another semiconductor storage device as shown in FIG. 18 (refer to the prior art reference of Japanese Patent Laid-Open Publication No. HEI 6-139787). The control timing of the above semiconductor storage device is shown in FIG. 19.

In FIG. 18 are shown a memory cell MC, a dummy memory cell DMC, precharge transistors PC and DPC, a word line WL, a precharge signal line /PR, a bit line BL, a dummy bit line DBL, a level detecting circuit 132 and a data output circuit 133. A decoding signal WD is inputted to one input terminal of a two-input NOR circuit 130 via an inverter 141, while a DE signal is inputted from the level detecting circuit section 132 to the other input terminal of the two-input NOR circuit 130. An output terminal of the two-input NOR circuit 130 is connected to the word line WL. A clock signal CLK is inputted to one input terminal of a two-input NOR circuit 131, while the DE signal is inputted to the other input terminal of the two-input NOR circuit 131. The output terminal of the two-input NOR circuit 131 is connected to the precharge signal line /PR. The level detecting circuit section 132 is constructed of inverters 135 and 136, a flip-flop circuit 134, a two-input NAND circuit 143 and an inverter 144. The data output circuit section 133 is constructed of inverters 137 and 138 and a flip-flop circuit 139.

In the semiconductor storage device having the above construction, as shown in FIGS. 19A through 19H, by providing a period during which the clock signal CLK (shown in FIG. 19A) comes to have H-level (high level) and making the precharge signal line /PR (shown in FIG. 19B) have L-level (low level), the transistors PC and DPC are turned on to execute the precharging of the bit line BL and the dummy bit line DBL (shown in FIGS. 19E and 19F).

Next, the potential of the selected word line WL (shown in FIG. 19D) rises to turn on the memory cell transistor MC and the dummy memory cell transistor DMC, executing the sensing of the bit line BL and the dummy bit line DBL by the memory cell transistor MC and the dummy memory cell transistor DMC, respectively.

Subsequently, if the potential of the bit line BL becomes lower than a circuit threshold value of an inverter 137 provided inside the data output circuit section 133, then the output of the inverter 137 is amplified to H-level, and the inverter 138 outputs L-level. Then, the output of the inverter 138 is latched in the latch circuit 139, making an output signal Dout have L-level (shown in FIG. 19H).

The sensing of the dummy bit line DBL is executed by the dummy memory cell transistor DMC, and therefore, the potential of the dummy bit line DBL is also lowered similarly to the potential of the bit line BL.

Subsequently, if the potential of the dummy bit line DBL becomes lower than the circuit threshold value of the inverter 135 provided inside the level detecting circuit section 132, then the output of the inverter 135 is amplified to H-level, and a power voltage Vcc is inputted as data into the flip-flop circuit 134, changing the level of the output signal DE from L-level to H-level (shown in FIG. 19G).

If the level of the output signal DE changes to H-level, then the output of the two-input NOR circuit 130 to which the output signal DE is inputted comes to have L-level, as a consequence of which the memory cell transistor MC and the dummy memory cell transistor DMC are turned off. The output signal /PR of the two-input NOR circuit 131 to which the output signal DE is inputted also comes to have L-level to turn on the precharge transistors PC and DPC, consequently precharging the bit line BL and the dummy bit line DBL, respectively.

In the semiconductor storage device having the construction shown in FIG. 18, the precharge timing is also automatically changed depending on the load capacitance of the bit line when designing a memory of a variety of sizes required for a memory of ASIC (application-specific integrated circuit) or the like, and therefore, the circuit designing can be easily achieved.

In the normal mask ROM controlled in accordance with the timing shown in FIG. 17, the bit line load is increased when a lot of memory cells are connected to the bit line, and the time necessary for the precharge operation and the equalizing operation of the bit line and the virtual GND line as well as the bit line sensing operation by the memory cell occupies about fifty percent of the access time. Some devices have the time two or more times greater than the time required for the turn on of the word line. If a small number of memory cells are connected to the bit line, then the time necessary for the precharge operation and the equalizing operation of the bit line and the virtual GND line as well as the bit line sensing operation by the memory cell occupies about thirty percent of the access time. There is an attempt at reducing the load of the bit line by dividing the bit line for the purpose of increasing the access time speed, for the reduction of the time necessary for the precharge operation and the equalizing operation. However, according to the system in which the bit line is divided, there is resulting an increased number of precharge circuits, sense amplifiers and column decoders, and this incurs a significant increase in chip size.

The semiconductor storage device shown in FIG. 18 detects a reduction in level of DBL and then enters into the bit line precharge operation. Another embodiment of the same prior art reference detects a change in potential of the read data and then enters into the precharge operation. These cases require a means for detecting the reduction in level of DBL and the change in output potential.

SUMMARY OF THE INVENTION

Accordingly, the object of the present invention is to reduce the precharge operation time and increase the access time speed by executing the precharge operation after the amplification of the bit line without using the above-mentioned detecting means.

In order to achieve the object, there is provided a semiconductor storage device having:

a plurality of memory cells arranged in a matrix form, word lines for activating the memory cells of an identical row of the plurality of memory cells, bit lines connected to one terminal of the memory cells of an identical column of the plurality of memory cells and virtual GND lines connected to the other terminal of the memory cells of an identical column of the plurality of memory cells, the semiconductor storage device comprising:

a sense amplifier that holds and amplifies a signal representing a potential difference between a potential of a reference line and a potential of the bit line connected to the column of selected memory cells upon completion of turn on of the word line in a read operation; and precharge potential supply circuits that supply a precharge potential to all the bit lines and the virtual GND lines at a power supply start time and supply a precharge potential to the bit line and virtual GND line of the column of the memory cells that have been selected, after completion of a period during which the bit line connected to the column of the selected memory cell is sensed by the memory cells in the read operation.

According to the semiconductor storage device having the above construction, the precharge potential supply circuit supplies the precharge potential to all the bit lines and the virtual GND lines in the power supply start stage, and the precharge potential of the bit lines and the virtual GND lines is maintained in a standby stage. Then, by supplying no precharge potential to the bit line and the virtual GND line connected to the column of the memory cells selected simultaneously with the turn on of the word line by the address input in the read operation, the bit line sensing (drawing) is executed by the memory cells. Then, the signal representing the potential difference between the potential of the reference line and the potential of the bit line connected to the column of the selected memory cells is held and amplified by the sense amplifier upon the completion of the turn on of the word line. In this stage, after the end of the period during which the bit line connected to the column of the selected memory cells is sensed by the memory cells, the precharge potential is immediately supplied to the bit lines and the virtual GND lines connected to the column of the memory cells that have been selected, by which the precharge potential of all the bit lines and the virtual GND lines is maintained. By thus constantly maintaining the precharge potential of all the bit lines and virtual GND lines prior to the read operation, the time required for the precharge operation and the equalizing operation can be saved without bit line division, allowing the access time speed to be increased.

As is apparent from the above, according to the semiconductor storage device of the present invention, by applying the all-bit line precharging system to the normal mask ROM or the like for executing random access, the precharging time, equalizing time and the bit line sensing operation time by means of the memory cell can be reduced by comparison with the conventional system, allowing the access time speed to be increased. This is effective particularly for the normal mask ROM in which the bit line precharging time and the bit line equalizing time needs about two times the word line turn on time.

The mask ROM in which the bit line precharging time and the bit line equalizing time are reduced by dividing the bit line into two parts for the achievement of an increased access speed needs about double number of sense amplifiers, precharge circuits and column decoders, and this has resulted in an increase in chip size by about 20%. However, with the application of the present invention, an increase in speed of about 10 ns can be achieved by the reduction in the bit line sensing time by means of the memory cell, and an increase in chip size becomes less than about 10%.

Furthermore, the bit line amplification can be achieved by the sense amplifier concurrently with the completion of the turn on of the word line even if the word line is divided for further increase in speed, and therefore, the access time speed can be further increased.

In one embodiment of the present invention, a semiconductor storage device, comprising:

a disconnecting circuit that disconnects the bit lines and the reference line both connected to the sense amplifier from the sense amplifier during a period of an amplifying operation of the sense amplifier and disconnects the virtual GND lines connected to the ground potential from the sense amplifier during the period of the amplifying operation of the sense amplifier when the sense amplifier holds the signal representing the potential difference between the potential of the bit line and the potential of the reference line in the read operation.

According to the above embodiment, the sense amplifier holds the signal representing the potential difference between the potential of the bit line and the potential of the reference line after the completion of the sensing (drawing) of the bit line by the memory cells on the bit line and the virtual GND line of the column of the selected memory cells in the read operation, and then the disconnecting circuit disconnects the bit line connected to the sense amplifier from the reference line during the amplifying operation of the sense amplifier and disconnects the virtual GND line connected to the ground potential during the amplifying operation of the sense amplifier. Accordingly, this enables the supply of the precharge potential to the bit line and the virtual GND line of the column of the selected memory cells immediately after the sensing (drawing) of the bit line by the memory cells.

In one embodiment of the present invention, a semiconductor storage device, comprising:

an access discriminating circuit that recognizes the read operation being effected when an address is newly inputted in the read operation that continues from address input to data output and outputs to the precharge potential supply circuits a precharge request signal for supplying a precharge potential to the bit lines and the virtual GND lines.

According to the above embodiment, when the next address is inputted by the time of the output of read data, the access discriminating circuit outputs the precharge request signal to execute the precharge operation on the new bit line and virtual GND line. This can cope with an irregular address input inputted in the read operation that continues from the address input to the data output.

In one embodiment of the present invention, a semiconductor storage device, comprising:

a normal precharge potential generating circuit that forms the precharge potential to be supplied to the bit lines and the virtual GND lines;

a power-on stage precharge potential generating circuit that forms a power-on stage precharge potential to be supplied to the bit lines and the virtual GND lines in a turn on time slower than that of the normal precharge potential generating circuit; and a precharge potential changeover circuit that outputs the power-on stage precharge potential formed by the power-on stage precharge potential generating circuit to the precharge potential supply circuit in the power supply start stage and thereafter changes the precharge potential to the normal precharge potential formed by the normal precharge potential generating circuit and outputs the normal precharge potential to the precharge potential supply circuits upon recognizing that the precharging of all the bit lines and the virtual GND lines is completed via the precharge potential supply circuits with the power-on stage precharge potential.

According to the semiconductor storage device of the above embodiment, the power-on stage precharge potential generating circuit supplies the precharge potential to all the bit lines and all the virtual GND lines consuming a turn on time of, for example, several microseconds ($\mu s$) in the power supply start stage, by which the instantaneous current due to the precharge operation of all the bits can be controlled. Next, the precharge potential changeover circuit compares the precharge potential supplied by the power-on stage precharge potential generating circuit with the precharge potential formed by the normal precharge potential generating circuit. If the precharge potential supplied by the power-on stage precharge potential generating circuit reaches a specified potential, then the precharge potential is switched to the normal precharge potential formed by the normal precharge potential generating circuit and the normal precharge potential is outputted to the precharge potential supply circuit. By this operation, the capacity of supplying the precharge potential from the precharge potential supply circuit is improved, allowing the precharge potential to be instantaneously supplied in the read operation.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 19A–19H are control timing charts of the above semiconductor storage device.

DETAILED DESCRIPTION OF THE PREFERRED EMBODIMENTS

Figure 1:
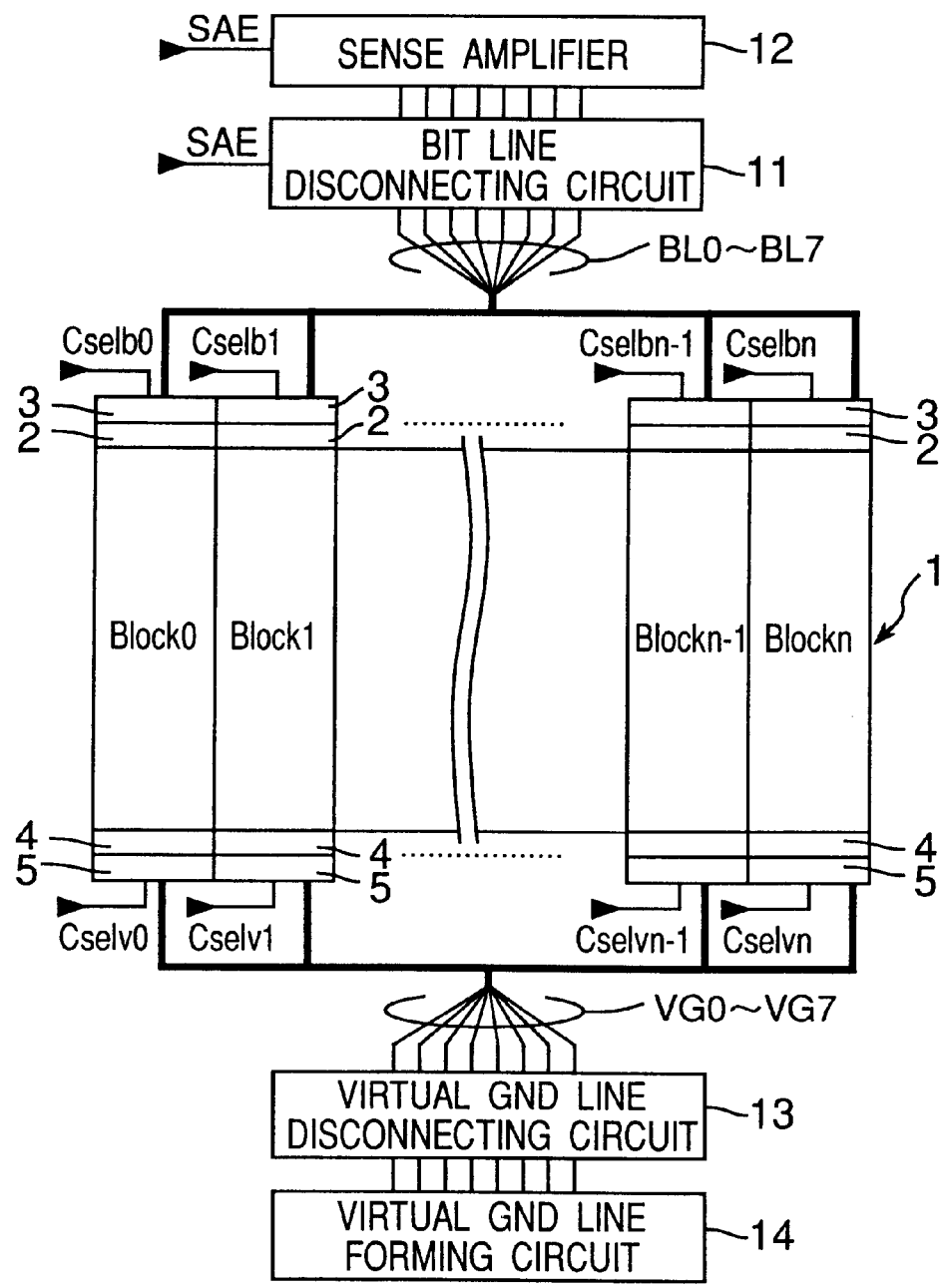
FIG. 1 is a block diagram of the essential part of a normal MROM that serves as a semiconductor storage device of the present invention.

The semiconductor storage device of the present invention will be described in detail below on the basis of the embodiments thereof shown in the drawings.

FIG. 1 is a block diagram of the essential part of a normal MROM that has a random access function and serves as a semiconductor storage device according to one embodiment of the present invention. As shown in FIG. 1, the present normal MROM is provided with a memory cell array 1 that has a plurality of memory blocks Block0 through Blockn obtained by dividing every eight columns a plurality of memory cells (not shown) arranged in a matrix form, a VREF potential supply circuit 2 that serves as a precharge potential supply circuit for supplying a precharge potential to bit lines BL0 through BL7 connected to one terminal of the memory cells of the memory cell array 1, a column selector 3 that selects a memory block designated by a column address inputted in a read operation, a VREF potential supply circuit 4 that serves as a precharge potential supply circuit for supplying a precharge potential to virtual GND lines VG0 through VG7 connected to the other terminal of the memory cells of the memory cell array 1, a column selector 5 that selects a memory block designated by a column address inputted in the read operation, a bit line disconnecting circuit 11 that disconnects bit lines BL0 through BL7 on the basis of a sense amplifier enable signal SAE, a sense amplifier 12 that amplifies a signal representing a potential difference between the potential of the bit lines BL0 through BL7 and a reference line (not shown) via the bit line disconnecting circuit 11 on the basis of the sense amplifier enable signal SAE, a virtual GND line disconnecting circuit 13 for disconnecting the virtual GND lines VG0 through VG7 on the basis of the sense amplifier enable signal SAE and a virtual GND line forming circuit 14 connected to the virtual GND lines VG0 through VG7 via the virtual GND line disconnecting circuit 13. The virtual GND line forming circuit 14 gives a ground potential to the desired virtual GND lines VG0 through VG7 according to the inputted address.

Figure 2:
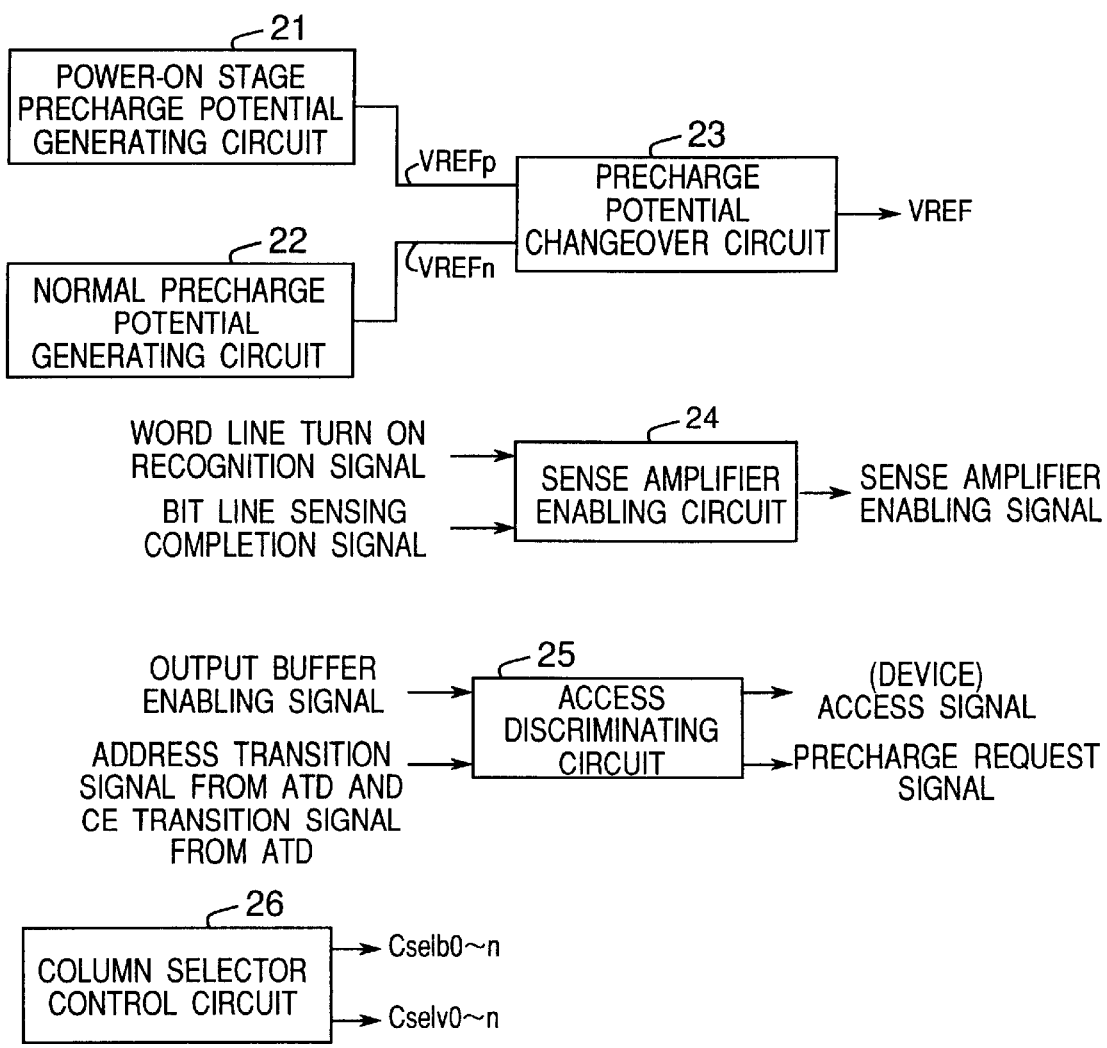
FIG. 2 is a block diagram of a peripheral section of the above normal MROM.

As shown in FIG. 2, a synchronous MROM is provided with a power-on stage precharge potential generating circuit 21 that supplies a power-on stage precharge potential VREFp within a specified turn on time to all the bit lines BL0 through BL7 and the virtual GND lines VG0 through VG7 in the power supply start stage, a normal precharge potential generating circuit 22 that supplies a normal precharge potential VREFn to the bit lines BL0 through BL7 and the virtual GND lines VG0 through VG7 after the power supply start, a precharge potential changeover circuit 23 that outputs in a switchover manner either the power-on stage precharge potential VREFp from the power-on stage precharge potential generating circuit 21 or the normal precharge potential VREFn from the normal precharge potential generating circuit 22, a sense amplifier enabling circuit 24 that outputs a sense amplifier enable signal upon receiving a word line turn on recognition signal and a bit line sensing completion signal, an access discriminating circuit 25 that outputs a (device) access signal and a precharge request signal upon receiving an output buffer enable signal and an address transition signal (and a CE transition signal) from an ATD (Address Transition Detector) and a column selector control circuit 26 that outputs column selection signals Cselb0 through Cselbn and Cselv0 through Cselvn.

Figure 3:
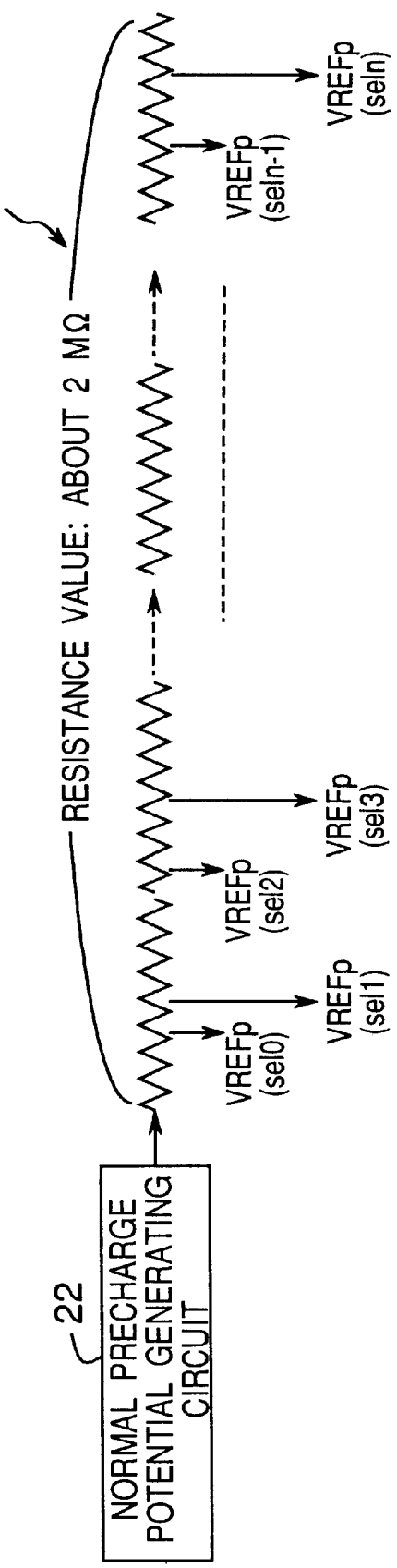
FIG. 3 is a view showing the construction of the essential part of a power-on stage precharge potential generating circuit of the above normal MROM.

FIG. 3 is a view showing the construction of the essential part of the power-on stage precharge potential generating circuit 21. The normal precharge potential VREFn output of the normal precharge potential generating circuit 22 is connected to one terminal of a series resistor R10 (about 2 MΩ) provided inside the power-on stage precharge potential generating circuit 21. The series resistor R10 is constructed of a plurality of resistors connected in series.

After the power-on stage precharge potential generating circuit 21 (shown in FIG. 2) detects the start of power supply, the normal precharge potential generating circuit 22 forms the normal precharge potential VREFn and inputs the normal precharge potential VREFn to the series resistor R10 (about 2 MΩ) provided inside the power-on stage precharge potential generating circuit 21. An output signal obtained through the series resistor R10 becomes the normal precharge potential VREFn that includes the power-on stage precharge potentials VREFp(sel0), VREFp(sel1), . . . , VREFp(seln) for supplying a precharge potential to the memory cell array 1.

The power-on stage precharge potential generating circuit 21 is intended to charge all the bit lines with the precharge potential after the start of power supply. However, if all the bit lines are instantaneously precharged, then an excessive instantaneous current is generated. Therefore, in order to restrain this instantaneous current, the normal precharge potential VREFn is supplied to the inside of the memory cell array 1 in a time-sharing manner. That is, the normal precharge potential VREFn is inputted to one terminal of the resistor R10 of about 2 MΩ, and the power-on stage precharge potentials VREFp(sel0) through VREFp(seln) are taken out partways sequentially from the resistor R10 from the one terminal to the other terminal of the resistor Rio. The power-on stage precharge potentials VREFp(sel0) through VREFp(seln) that are taken out are supplied to the bit lines. With this arrangement, the precharging is executed sequentially from the bit line to which the power-on stage precharge potential VREFp(sel0) is applied via a small resistance value to the bit line to which the power-on stage precharge potential VREFp(seln) is applied via a great resistance value. By thus precharging all the bit lines, the instantaneous current can be restrained.

Figure 4:
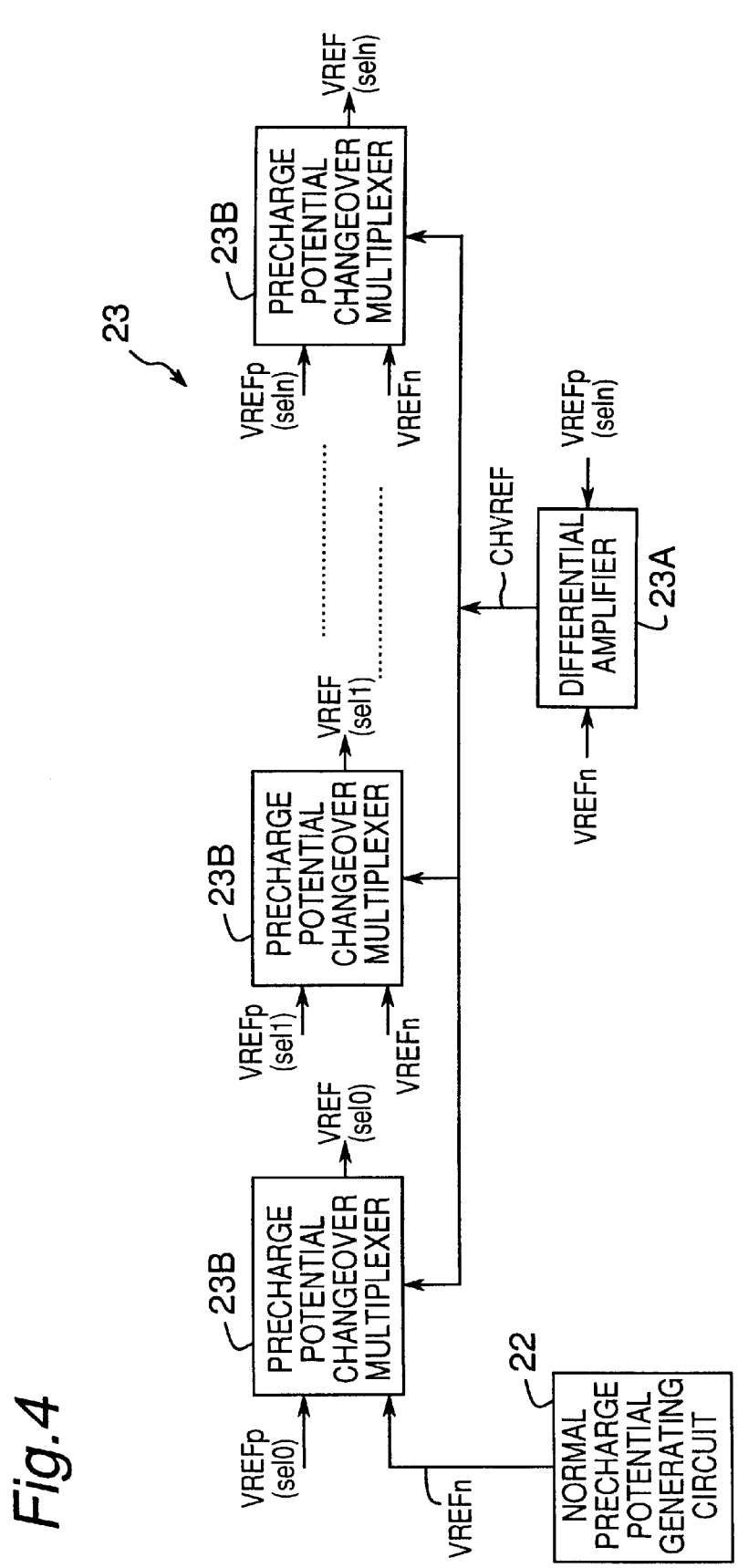
FIG. 4 is a block diagram of a normal precharge potential generating circuit and a precharge potential changeover circuit of the above normal MROM.

FIG. 4 is a detailed block diagram of the normal precharge potential generating circuit 22 and the precharge potential changeover circuit 23. As shown in FIG. 4, the precharge potential changeover circuit 23 is constructed of a differential amplifier 23A and a plurality of precharge potential changeover multiplexers 233, 23B, . . .

The power-on stage precharge potential VREFp(seln) from the power-on stage precharge potential generating circuit 21 (shown in FIG. 2) is inputted to one terminal of the differential amplifier 23A, while the normal precharge potential VREFn from the normal precharge potential generating circuit 22 is inputted to the other terminal of the differential amplifier 23A. The power-on stage precharge potentials VREFp(sel0) through VREFp(seln) from the power-on stage precharge potential generating circuit 21 (shown in FIG. 2) are inputted to one terminal of the precharge potential changeover multiplexers 23B, 23B, . . . , while the normal precharge potential VREFn from the normal precharge potential generating circuit 22 is inputted to the other terminal of the precharge potential changeover multiplexers 23B, 23B, . . .

As shown in FIG. 4, the differential amplifier 23A provided inside the precharge potential changeover circuit 23 compares the inputted power-on stage precharge potential VREFp(seln) with a potential that is four-fifths of the normal precharge potential VREFn. The differential amplifier 23A outputs an H-level changeover signal CHVREF when the power-on stage precharge potential VREFp(seln) exceeds the potential that is four-fifths of the normal precharge potential VREFn. Then, the precharge potentials outputted from the precharge potential changeover multiplexers 23B, 23B, . . . are changed from the power-on stage precharge potentials VREFp(sel0) through VREFp(seln) to the normal precharge potential VREFn on the determination that the precharging in the power supply start stage has been completed.

Figure 5:
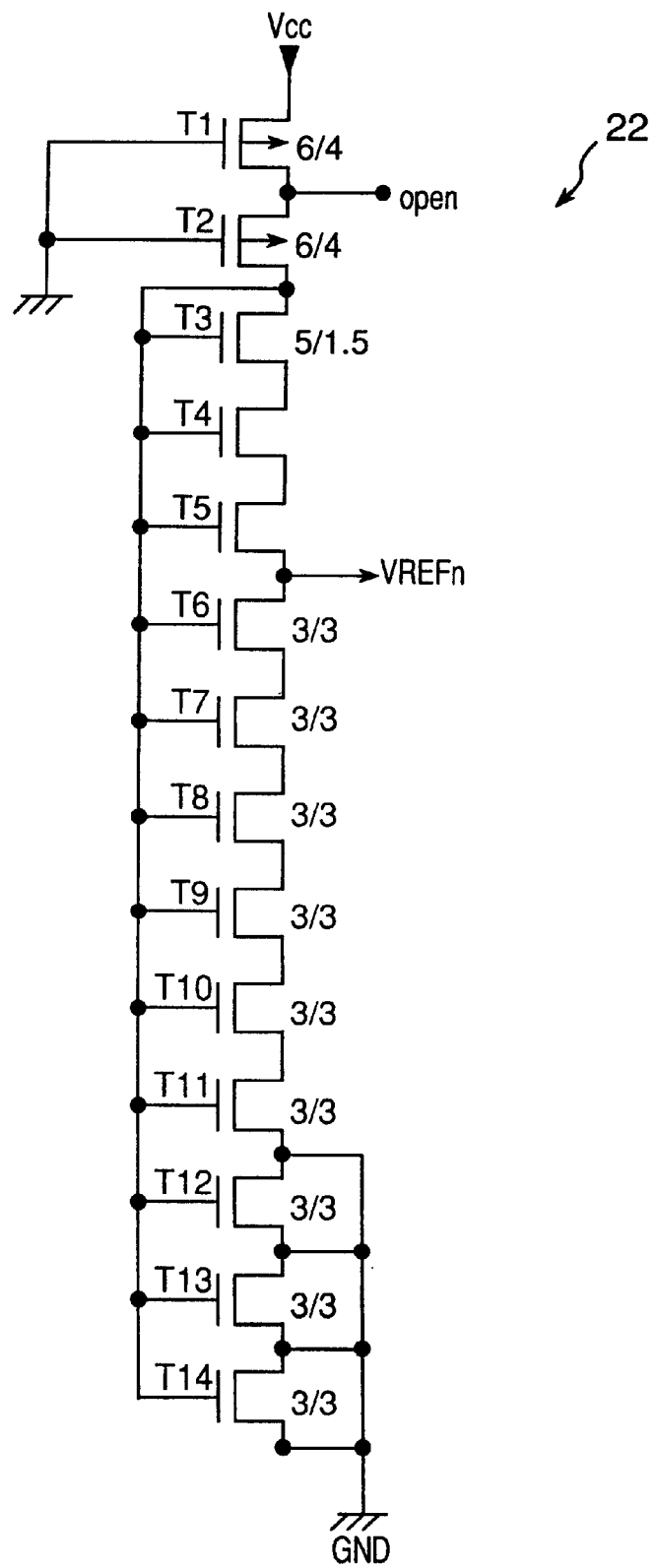
FIG. 5 is a circuit diagram of the normal precharge potential generating circuit of the above normal MROM.

FIG. 5 is a circuit diagram of the normal precharge potential generating circuit 22. As shown in FIG. 5, a power voltage Vcc is applied to the source of a p-channel type transistor T1 whose gate is connected to the ground GND, and the source of a p-channel type transistor T2 is connected to the drain of the transistor T1. The gate of the transistor T2 is connected to the ground GND. Then, the drain of a n-channel type transistor T3 is connected to the drain of the transistor T2, and the drain of a n-channel type transistor T4 is connected to the source of the transistor T3. In a similar manner, n-channel type transistors T5 through T14 are connected in series. The gates of the n-channel type transistors T3 through T14 are connected together, and the sources of the transistors T11 through T14 are connected to the ground GND. Then, the normal precharge potential VREFn is outputted from the drain of the n-channel type transistor T6.

Figure 6:
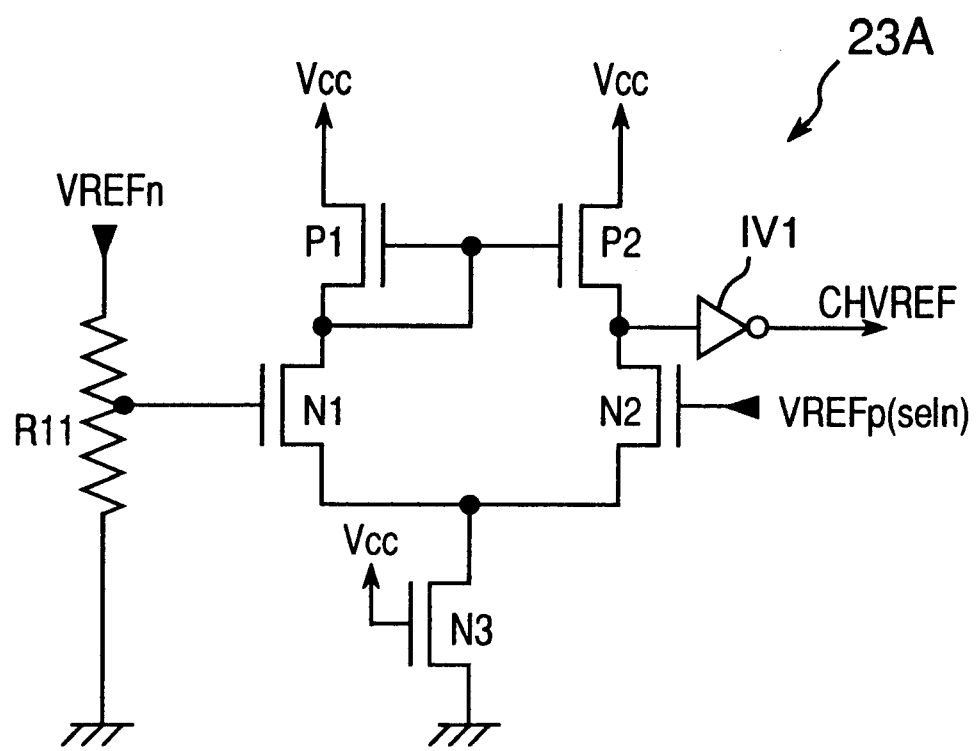
FIG. 6 is a circuit diagram of a differential amplifier of the above normal MROM.

FIG. 6 shows a circuit diagram of the differential amplifier 23A. As shown in FIG. 6, the differential amplifier 23A includes p-channel type transistors P1 and P2 that have gates connected together and sources to which the power voltage Vcc is applied, an n-channel type transistor N1 that has a drain connected to the gate and drain of the transistor P1, a n-channel type transistor N2 that has a drain connected to the drain of the transistor P2 and a gate to which the power-on stage precharge potential VREFp(seln) is applied, a n-channel type transistor N3 that has a drain connected to the sources of the transistors N1 and N2 and a source connected to the ground GND and a resistor R11 that has one terminal to which the normal precharge potential VREFn is applied and the other terminal connected to the ground GND. A voltage obtained by dividing the normal precharge potential VREFn by the resistor R11 is applied to the gate of the transistor N1.

The differential amplifier 23A compares the inputted power-on stage precharge potential VREFp(seln) with a potential that is four-fifths of the normal precharge potential VREFn. The differential amplifier 23A outputs an H-level changeover signal CHVREF when the power-on on stage precharge potential VREFp(seln) exceeds the potential that is four-fifths of the normal precharge potential VREFn.

Figure 7:
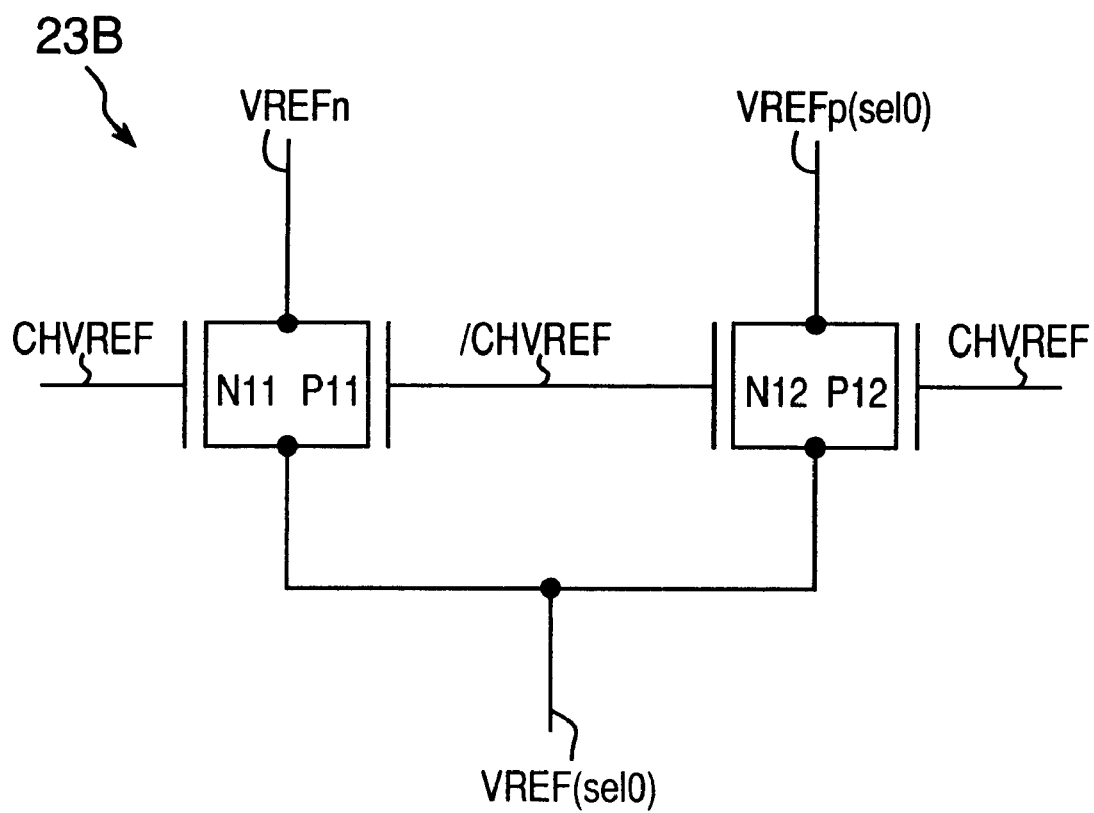
FIG. 7 is a circuit diagram of a precharge potential changeover multiplexer of the above normal MROM.

FIG. 7 shows a circuit diagram of the precharge potential changeover multiplexer 23B (shown in FIG. 4). FIG. 7 shows the precharge potential changeover multiplexer 23B for outputting the precharge potential VREF(sel0), while the precharge potential changeover multiplexers 23B for outputting the other precharge potentials VREF(sel1) through VREF(seln) have the same construction.

As shown in FIG. 7, the precharge potential changeover multiplexer 23B includes a n-channel type transistor N11 that has a gate to which the changeover signal CHVREF from the differential amplifier 23A is inputted and a drain to which the normal precharge potential VREFn is applied, a p-channel type transistor P11 that has a source connected to the drain of the transistor N11 and a gate to which a changeover signal /CHVREF is inputted, a n-channel type transistor N12 that has a gate connected to the gate of the transistor P11 and a drain to which the power-on stage precharge potential VREFp(sel0) is applied and a p-channel type transistor P12 that has a source connected to the drain of the transistor N12 and a gate to which the changeover signal CHVREF is inputted.

The sources of the transistors N11 and N12 are connected to the drains of the transistors P11 and P12, respectively. The precharge potential VREF(sel0) is outputted from the connection point of the sources of the transistors N11 and N12 and the drains of the transistors P11 and P12.

When the changeover signal CHVREF has L-level, the precharge potential changeover multiplexer 23B selects the power-on stage precharge potentials VREFp(sel0) through VREFp(seln) from the normal precharge potential generating circuit 22 and outputs the same as the precharge potentials VREF(sel0) through VREF(seln), thereby supplying the precharge potentials in a time-sharing manner. When the changeover signal CHVREF has H-level, the precharge potential changeover multiplexer 23B selects the normal precharge potential VREFn that has a high precharge potential supply capacity from the normal precharge potential generating circuit 22 and outputs the same as the precharge potentials VREF(sel0) through VREF(seln), thereby allowing the precharge potential to be instantaneously supplied in the read operation.

Figure 8:
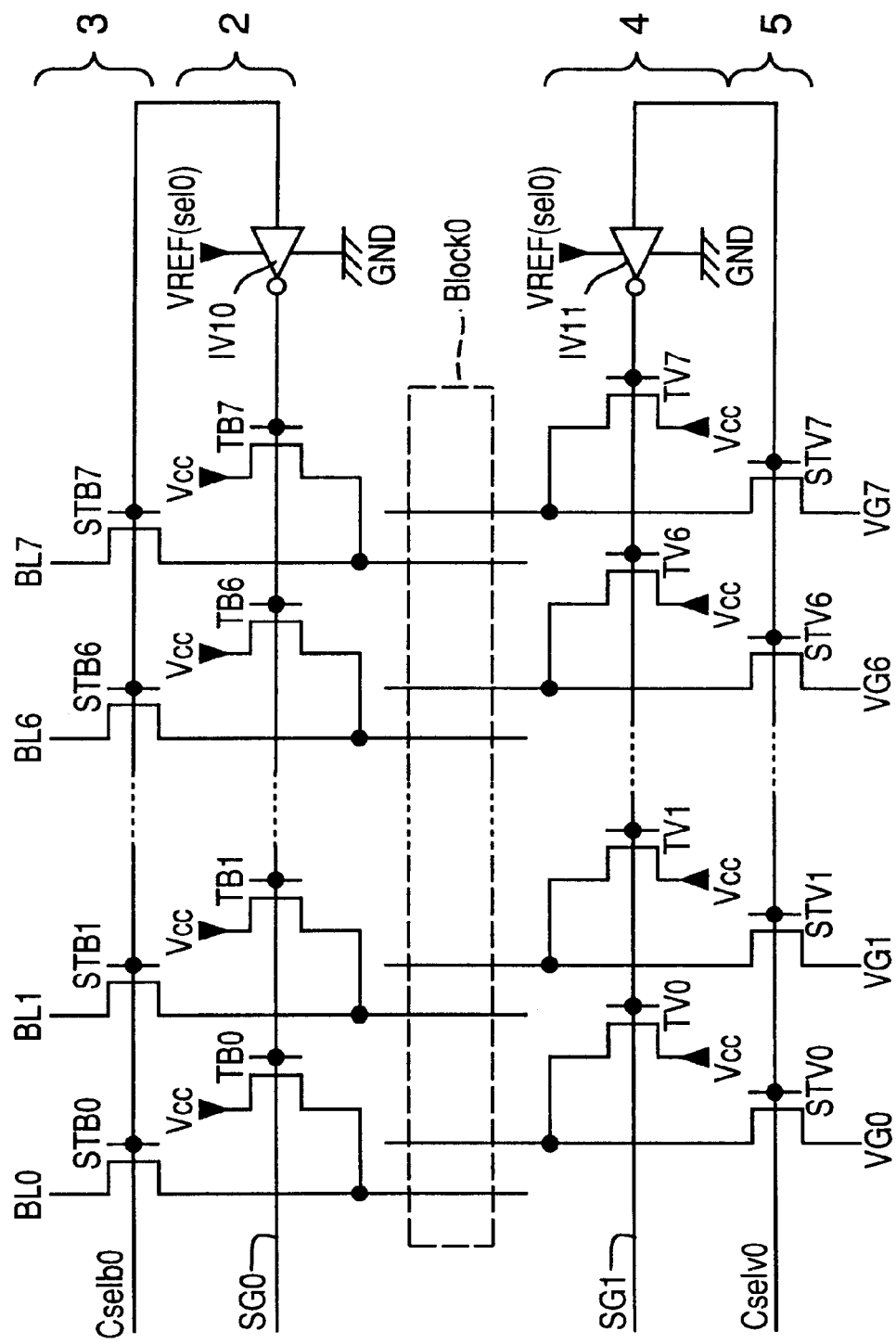
FIG. 8 is a circuit diagram of a column selector and a VREF potential supply circuit of the above normal MROM.

FIG. 8 shows a circuit diagram of the memory block Blobk0 shown in FIG. 1, the column selectors 3 and 5, the VREF potential supply circuit 2 and the VREF potential supply circuit 4. It is to be noted that the other memory blocks Block1 through Blockn have the same construction.

As shown in FIG. 8, the bit lines BL0 through BL7 are connected to one terminal of the memory cells (not shown) of an identical column of the memory block Blobk0 of the memory cell array 1 (shown in FIG. 1). Transistors TB0 through TB7 have one terminal connected to the bit lines BL0 through BL7 and the power voltage Vcc is applied to the other terminal of the transistors TB0 through TB7. A gate signal line SG0 is connected to the gates of the transistors TB0 through TB7, an output terminal of an inverter IV10 is connected to one terminal of the gate signal line SG0 and a column selection signal Cselb0 is inputted to the input terminal of the inverter IV10. The transistors TB0 through TB7 and the inverter Iv10 constitute the VREF potential supply circuit 2. The precharge voltage VREF(sel0) is applied to the power input terminal of the inverter IV10. The bit lines BL0 through BL7 are connected to the bit line disconnecting circuit 11 (shown in FIG. 1) via selection transistors STB0 through STB7, respectively. The column selection signal Cselb0 is inputted to the gates of the selection transistors STB0 through STB7. The selection transistors STB0 through STB7 constitute the column selector 3 (shown in FIG. 1).

On the other hand, virtual GND lines VG0 through VG7 are connected to the other terminal of an identical column of the memory cell array 1. One terminal of transistors TV0 through TV7 are connected to the virtual GND lines VG0 through VG7, respectively, and the power voltage Vcc is applied to the other terminal of the transistors TV0 through TV7. The gate signal line SG1 is connected to the gates of the transistors TV0 through TV7, an output terminal of an inverter IV11 is connected to one terminal of the gate signal line SG1 and a column selection signal Cselv0 is inputted to the input terminal of the inverter IV11. The transistors TV0 through TV7 and the inverter IV11 constitute the VREF potential supply circuit 4 (shown in FIG. 1). The voltage VREF(sel0) is applied to the power input terminal of the inverter IV11. The virtual GND lines VG0 through VG7 are connected to the virtual GND line disconnecting circuit 13 (shown in FIG. 1) via selection transistors STV0 through STV7, respectively. The column selection signal Cselv0 is inputted to the gates of the selection transistors STV0 through STV7. The selection transistors STV0 through STV7 constitute the column selector 5 (shown in FIG. 1). It is to be noted that a word line for activating the memory cells of an identical row of the memory blocks Block0 through Blockn is provided although not shown.

In FIG. 8, all the column selection signals Cselb0 and Cselv0 of the column selectors 3 and 5 maintain L-level when the power is turned on. Therefore, the gate signal line SG0 provided inside the VREF potential supply circuit 2 and the gate signal line SG1 provided inside the VREF potential supply circuit 4 come to have the precharge voltage VREF (sel0) from the precharge potential changeover circuit 23. In particular, when the power is turned on, the power-on stage precharge potential VREFp(sel0) of the power-on stage precharge potential generating circuit 21 is selected as the precharge voltage VREF(sel0) from the precharge potential changeover circuit 23, and the potential of:

VREF(sel0)−Vth is applied to all the bit lines BL0 through BL7 and all the virtual GND lines VG0 through VG7 (Vth is the threshold voltage of the transistors TB0 through TB7 and TV0 through TV7).

Subsequently, the precharge potential VREF(sel0) is changed from the power-on stage precharge potential VREFp(sel0-n) of the power-on stage precharge potential generating circuit 21 to the normal precharge potential VREFn of the normal precharge potential generating circuit 22. Subsequently, in the standby stage, the normal precharge potential VREFn is supplied to the gate signal line SG0 provided inside the VREF potential supply circuit 2, and the normal precharge potential VREFn is supplied to the gate signal line SG1 provided inside the VREF potential supply circuit 4. Therefore, the potential of:

VREFn−Vth is supplied to all the bit lines BL0 through BL7 and all the virtual GND lines VG0 through VG7. It is to be noted that the potential of:

VREFp(sel0)−Vth has been supplied to all the bit lines BL0 through BL7 and all the virtual GND lines VG0 through VG7 in the power supply start stage. The potential merely compensates for the bit line leak and the virtual GND line leak, meaning that the standby current is considered to be about several tens of microamperes.

In the read operation, the precharge potential of:

VREFn−Vth is maintained on the bit lines and the virtual GND lines that are not accessed by the column address, similarly to the standby stage.

With regard to the bit lines and the virtual GND line that are accessed by the column address in the read operation, the GND potential is supplied to the gate signal line SG0 provided inside the VREF potential supply circuit 2, and the GND potential is supplied to the gate signal line SG1 provided inside the VREF potential supply circuit 4. Therefore, no precharge potential is supplied.

As described above, no precharge potential is supplied to the bit lines and the virtual GND lines within a time from the column address input to the completion of the turn on of the word line, allowing the bit lines to be sensed (drawn) by the memory cells.

Figure 9:
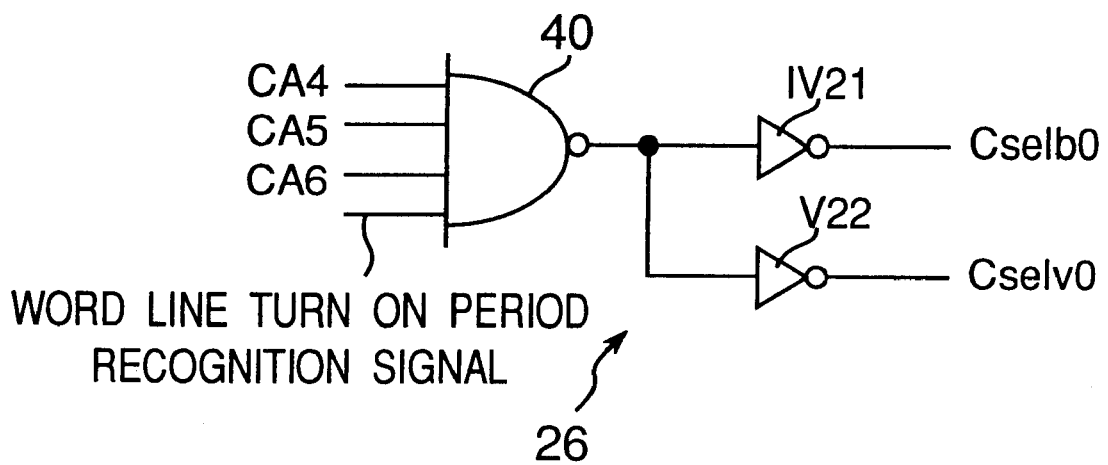
FIG. 9 is a circuit diagram of part of a column selector control circuit of the above normal MROM.

FIG. 9 is a circuit diagram of part of the column selector control circuit 26, showing a circuit for outputting a pair of column selection signals Cselb0 and Cselv0. It is to be noted that circuits for outputting the other column selection signals Cselb1 through Cselbn and Cselv1 through Cselvn have a similar circuit construction except that the column address input conditions are varied, and neither illustration nor description is provided for them.

As shown in FIG. 9, the column selector control circuit 26 has a four-input NAND circuit 40 to which column addresses CA4, CA5 and CA6 and a word line turn on period recognition signal are inputted and inverters IV21 and IV22 that have input terminals connected to the output terminals of the four-input NAND circuit 40 and output the column selection signals Cselb0 through Cselbn and Cselv0 through Cselvn, respectively. In FIG. 9, if the three column addresses CA4, CA5 and CA6 are inputted, then eight column selection signals can be obtained. However, the number of column addresses to be inputted should preferably be set according to the construction of the memory block and the like.

Figure 10:
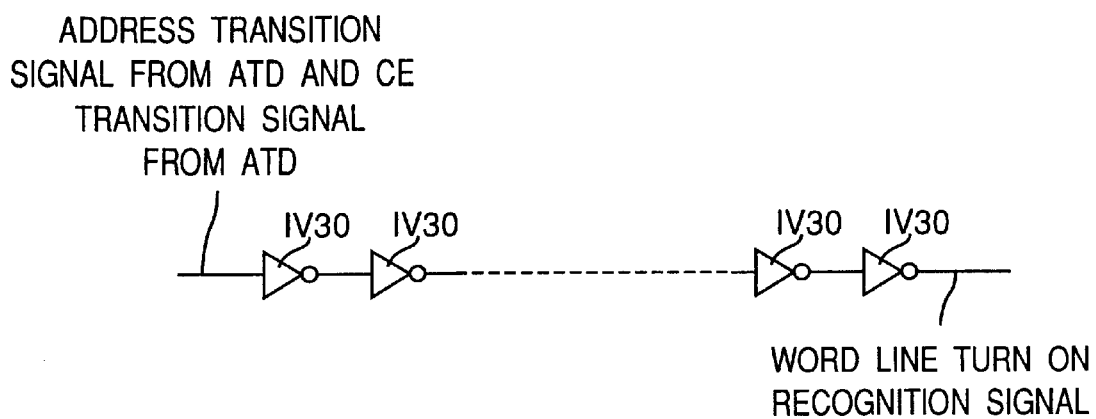
FIG. 10 is a circuit diagram of a circuit for obtaining a word line turn on recognition signal by delaying an address transition signal from ATD and a CE transition signal from ATD.

FIG. 10 shows a delay circuit for obtaining the word line turn on recognition signal by delaying the address transition signal from ATD and the CE transition signal from ATD. A plurality of inverters IV30 are connected in series and the address transition signal from ATD and the CE transition signal from ATD are inputted to the input terminal of the inverter IV30 of the first stage, and the word line turn on recognition signal is outputted from the output terminal of the inverter IV30 of the final stage.

Figure 11:
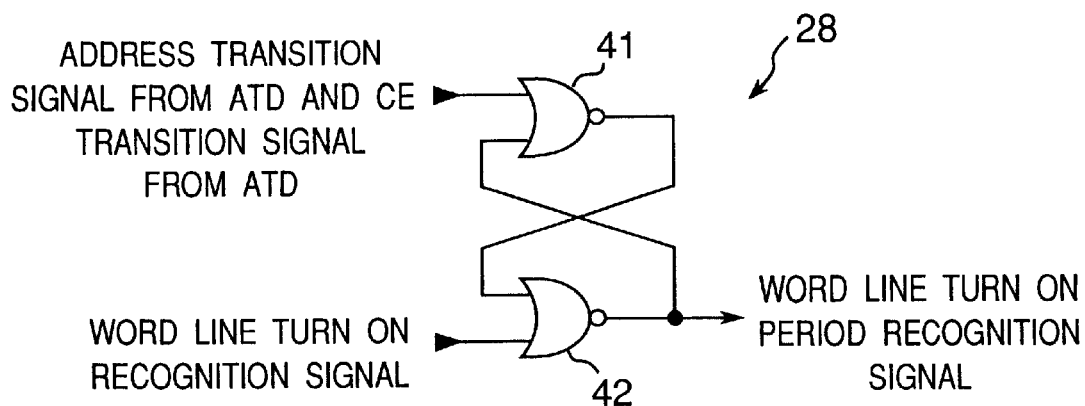
FIG. 11 is a circuit diagram of a bit line access period recognition circuit of the above normal MROM.

FIG. 11 shows a circuit diagram of the bit line access period recognition circuit 28. The address transition signal from ATD and the CE transition signal from ATD are inputted to one input terminal of a two-input NOR circuit 41, and an output terminal of the two-input NOR circuit 41 is connected to one input terminal of a two-input NOR circuit 42. The word line turn on recognition signal is inputted to the other input terminal of the two-input NOR circuit 42, and an output terminal of the two-input NOR circuit 42 is connected to the other input terminal of the two-input NOR circuit 41. The word line turn on period recognition signal is outputted from the output terminal of the two-input NOR circuit 42.

Figure 12:
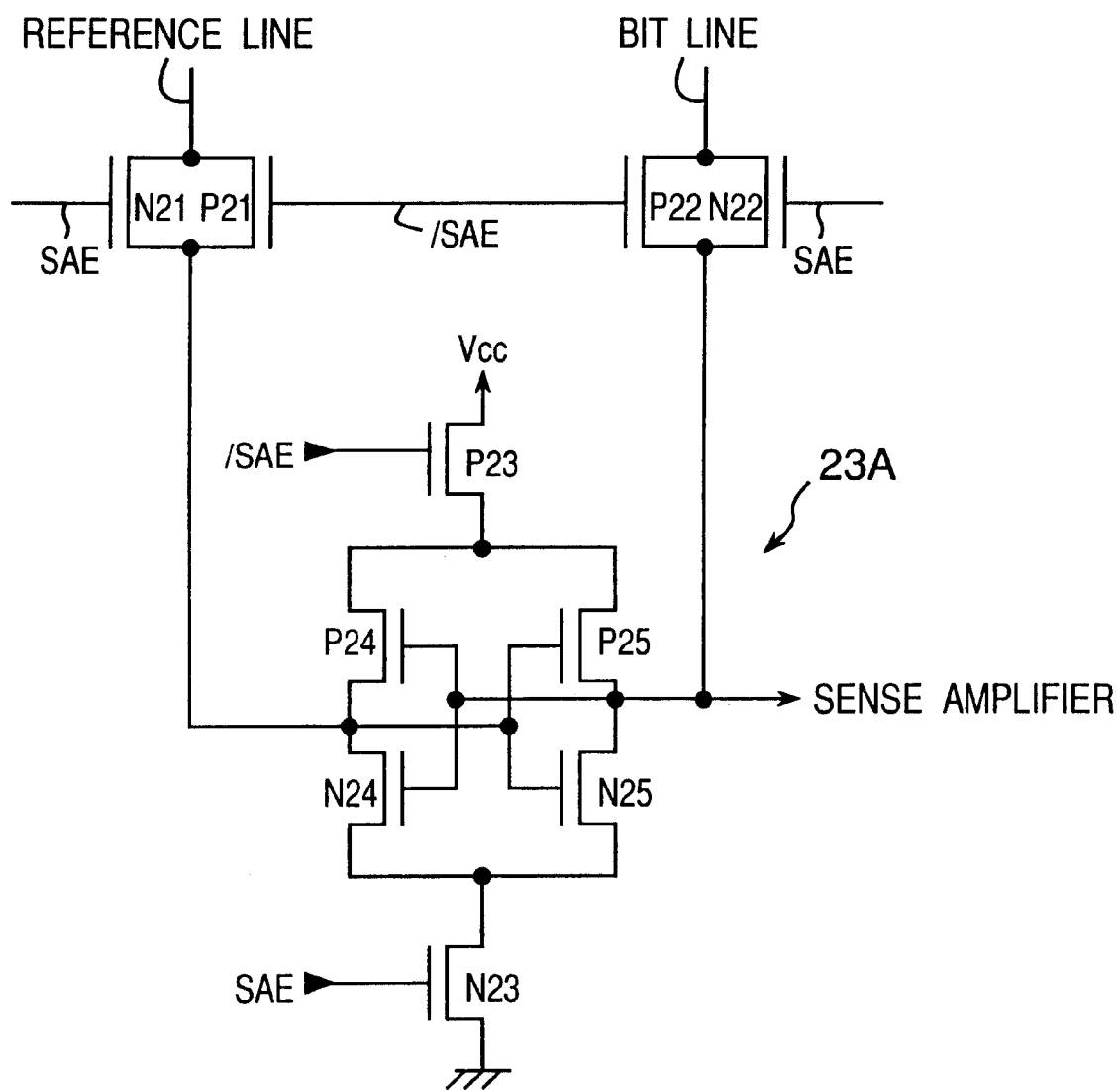
FIG. 12 is a circuit diagram of the essential part of a bit line disconnecting circuit and a sense amplifier of the above normal MROM.

Further, FIG. 12 shows a circuit diagram of the essential part of the bit line disconnecting circuit 11 and the sense amplifier 12. The reference line is connected to the drain of a n-channel type transistor N21, and a sense amplifier enable signal SAE is inputted from the sense amplifier enabling circuit 24 (shown in FIG. 2) to the gate of the transistor N21. The source of a p-channel type transistor P21 is connected to the drain of the transistor N21, and the drain of the transistor P21 is connected to the source of the transistor N21. A sense amplifier enable signal /SAE is inputted to the gate of the transistor P21. The bit line is connected to the drain of an n-channel type transistor N22, and the sense amplifier enable signal SAE is inputted to the gate of the transistor N22. The source of a p-channel transistor P22 is connected to the drain of the transistor N22, and the drain of the transistor P22 is connected to the source of the transistor N22. The sense amplifier enable signal /SAE is inputted to the gate of the transistor P22. The n-channel type transistors N21 and N22 and the p-channel type transistors P21 and P22 are provided for each bit line, constituting the bit line disconnecting circuit 11 (shown in FIG. 1).

Then, the power voltage Vcc is applied to the source of a p-channel type transistor P23 having a gate to which the sense amplifier enable signal /SAE is inputted, and the source of a p-channel type transistor P24 is connected to the drain of the transistor P23. The source of the transistor N21 is connected to the drain of the transistor P24. The drain of a n-channel type transistor N24 is connected to the drain of the transistor P24, and the drain of a p-channel type transistor N23 is connected to the source of the transistor N24. The sense amplifier enable signal SAE is inputted to the gate of the transistor N23, and the source of the transistor N23 is connected to the ground GND. The source of a n-channel type transistor N25 is connected to the drain of the transistor P23. The source of the transistor N22 is connected to the drain of the transistor P25. The drain of a n-channel type transistor N25 is connected to the drain of a p-channel type transistor P25, and the drain of the transistor N23 is connected to the source of the transistor N25. The drain of the transistor P24 is connected to the gate of the transistor P25 and the gate of the transistor N25. The drain of the transistor P25 is connected to the gate of the transistor P24 and the gate of the transistor N24. Then, a sense amplifier signal is outputted from the connection point of the drain of the transistor P25 and the drain of the transistor N25. The p-channel type transistors P23, P24 and P25 and the n-channel type transistors N23, N24 and N25 are provided for each bit line, constituting the sense amplifier 12 (shown in FIG. 1).

As shown in FIG. 12, the bit line disconnecting circuit 11 is able to latch the sense amplifier output by using a latch type sense amplifier for the sense amplifier 12 and execute parallel a read data amplifying operation by means of the sense amplifier 12 by disconnecting the sense amplifier 12 from the bit line and the reference line using the sense amplifier enable signal SAE and a precharge operation of the bit line and the virtual GND line disconnected by the bit line disconnecting circuit 11 and the virtual GND line disconnecting circuit 13.

Figure 13:
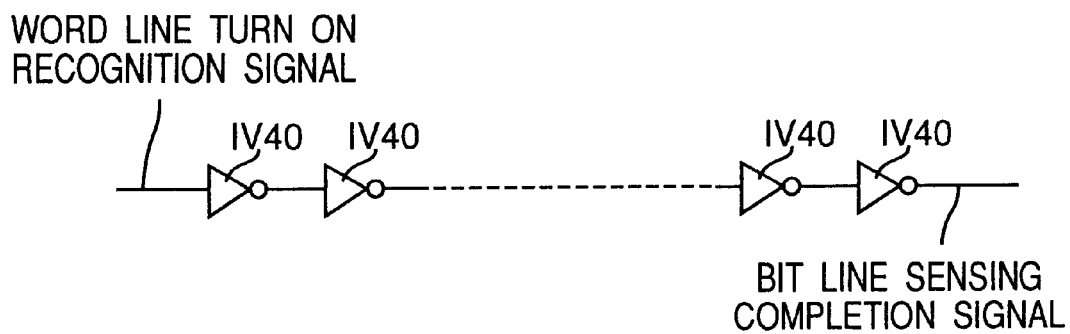
FIG. 13 is a circuit diagram of a circuit for obtaining a bit line sensing completion signal by delaying the word line turn on recognition signal.

FIG. 13 shows a delay circuit for obtaining a bit line sensing completion signal by delaying the word line turn on recognition signal. A plurality of inverters IV40 are connected in series, the word line turn on recognition signal is inputted to the input terminal of the inverter IV40 of the first stage and the bit line sensing completion signal is outputted from the output terminal of the inverter IV40 of the final stage.

Figure 14:
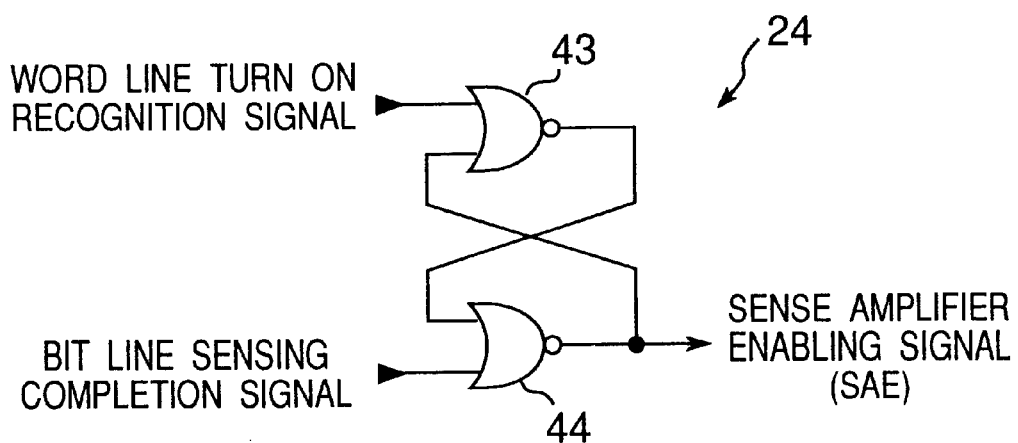
FIG. 14 is a circuit diagram of a sense amplifier enabling circuit of the above normal MROM.

FIG. 14 shows a circuit diagram of the sense amplifier enabling circuit 24. The word line turn on recognition signal is inputted to one input terminal of the two-input NOR circuit 43, and the output terminal of the two-input NOR circuit 43 is connected to one input terminal of the two-input NOR circuit 44. The bit line sensing completion signal is inputted to the other input terminal of the two-input NOR circuit 44, and the output terminal of the two-input NOR circuit 44 is connected to the other input terminal of the two-input NOR circuit 43. The sense amplifier enable signal SAE is outputted from the output terminal of the two-input NOR circuit 44.

Figure 15:
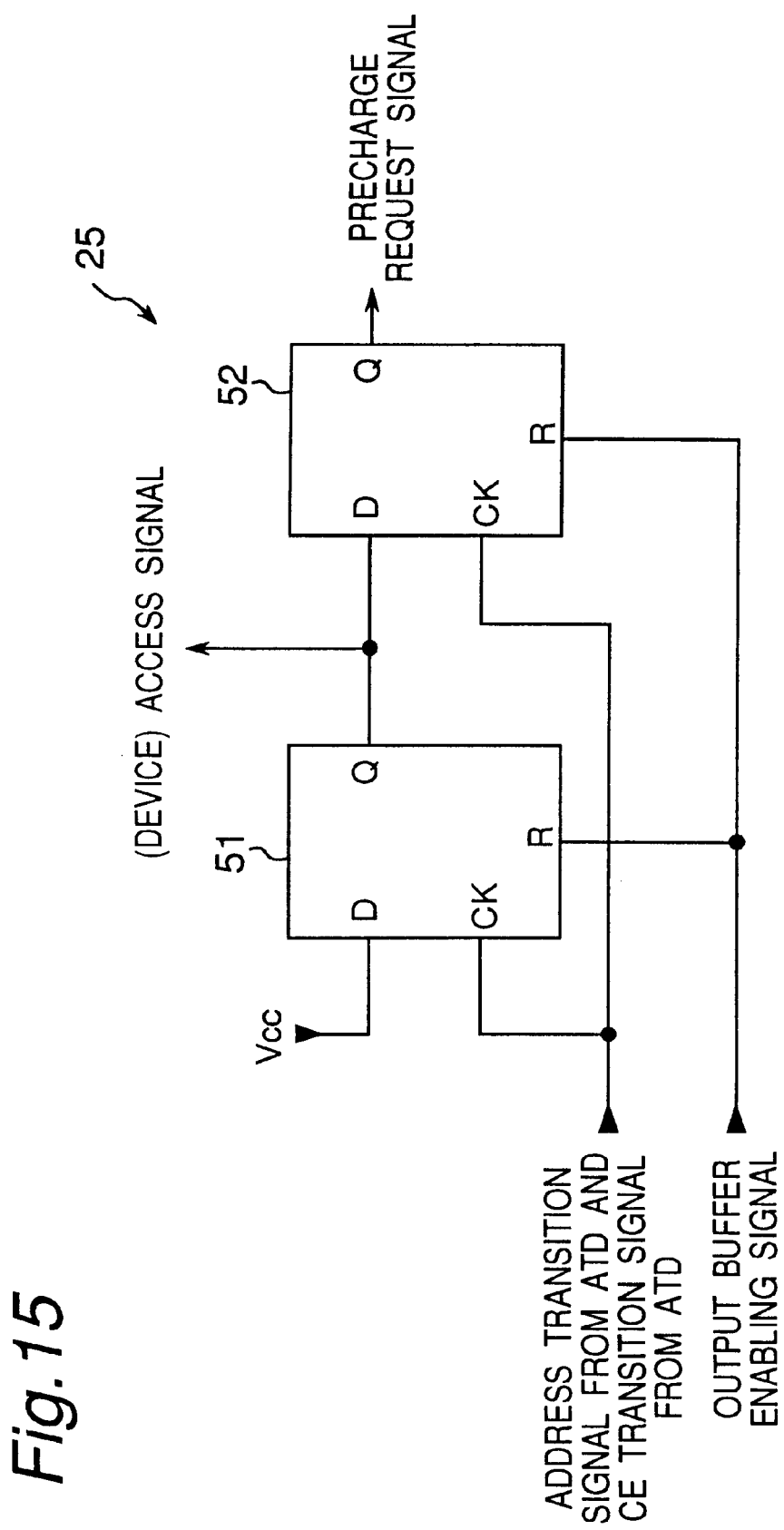
FIG. 15 is a circuit diagram of an access discriminating circuit of the above normal MROM.
Figure 16:
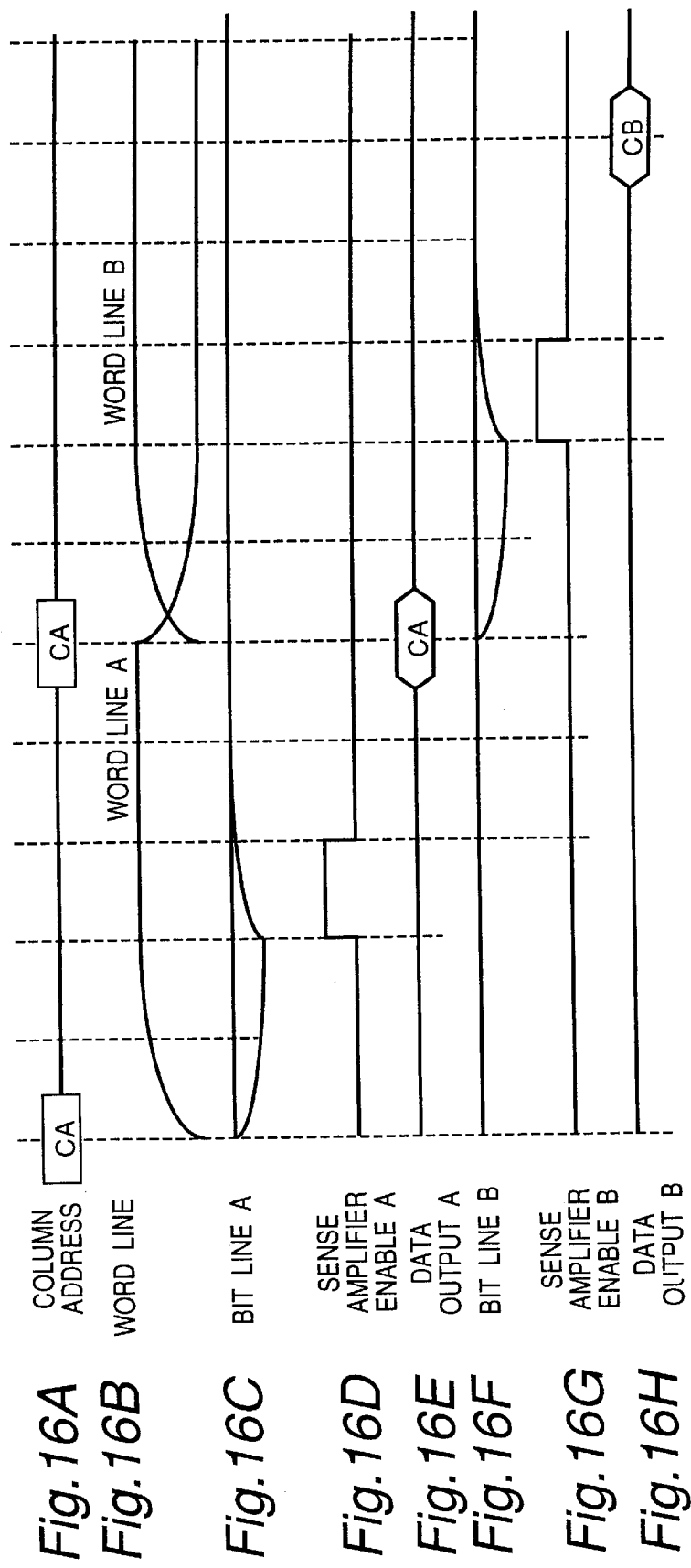
FIGS. 16A–16H are control timing charts of the above normal MROM.
Figure 17:
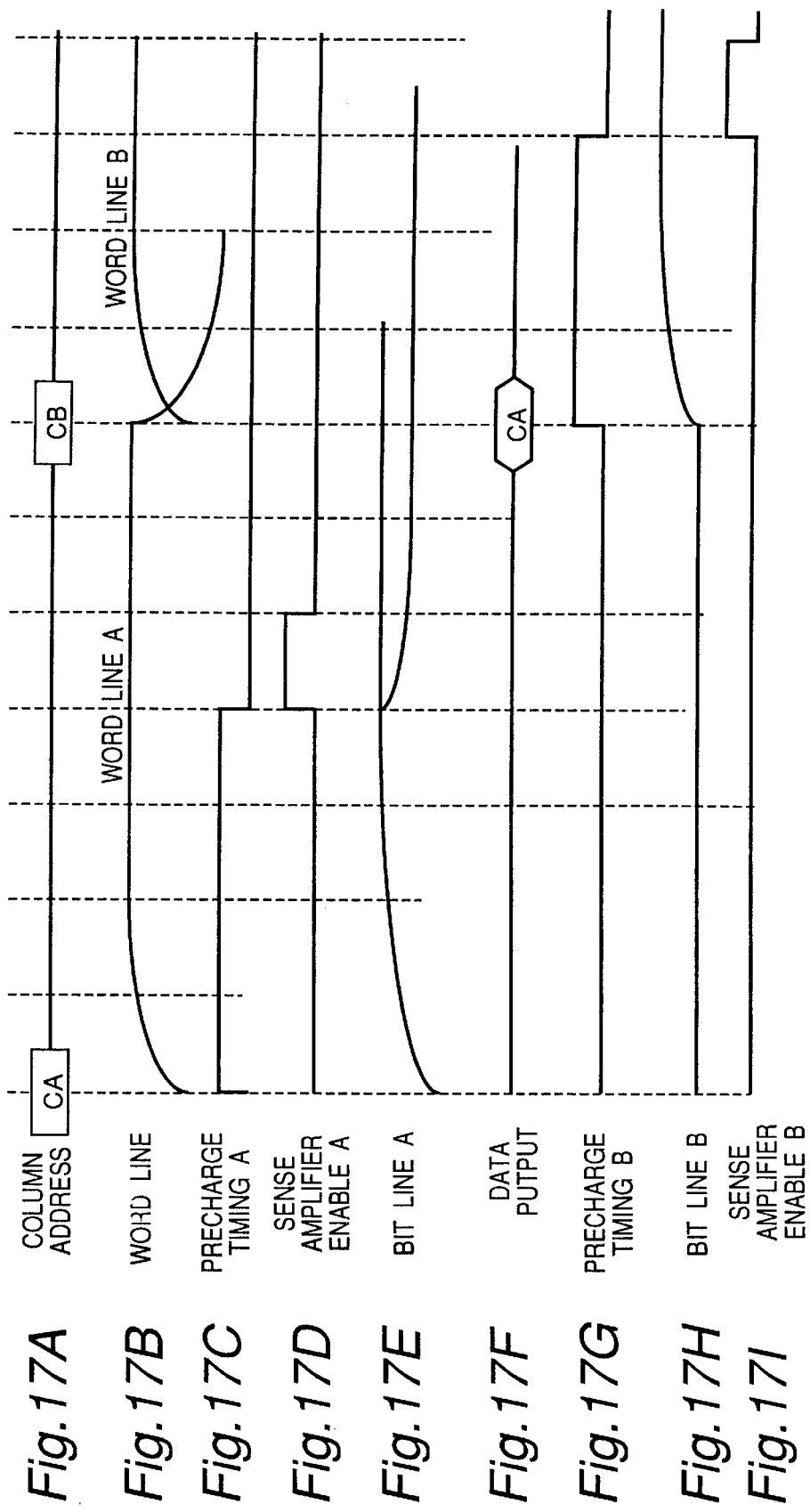
FIGS. 17A–17I are control timing charts of a conventional normal MROM.
Figure 18:
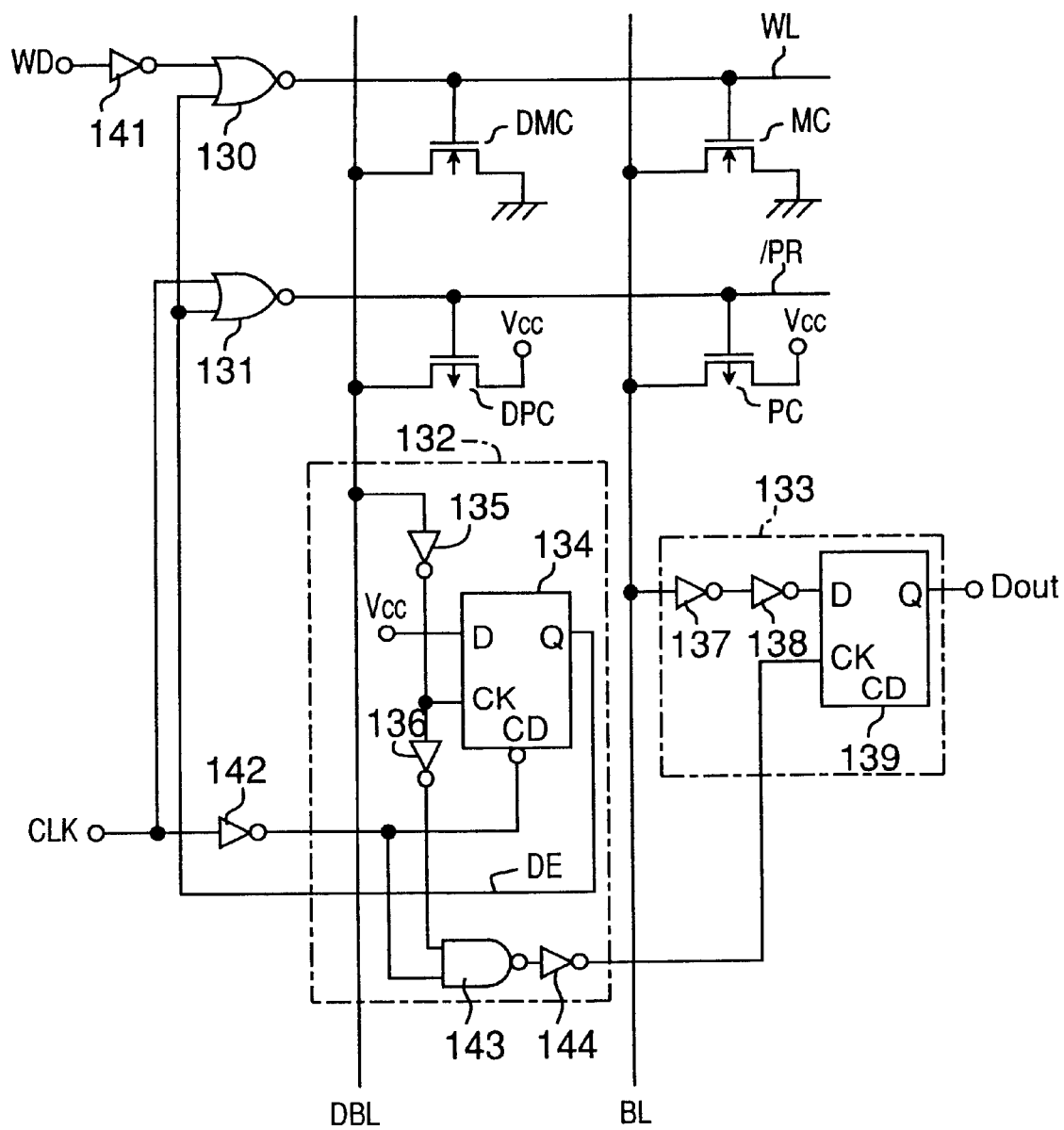
FIG. 18 is a circuit diagram of a conventional semiconductor storage device.

FIG. 15 shows a circuit diagram of the access discriminating circuit 25. The power voltage Vcc is applied to the input terminal D of a flip-flop circuit 51, and the address transition signal from ATD and the CE transition signal from ATD are inputted to a clock input terminal CK of the flip-flop circuit 51. Further, an output terminal Q of the flip-flop circuit 51 is connected to the input terminal D of a flip-flop circuit 52, and the address transition signal from ATD and the CE transition signal from ATD are inputted to a clock input terminal CK of the flip-flop circuit 52. An output buffer enable signal is inputted to reset input terminals R of the flip-flop circuits 51 and 52. Then, a (device) access signal is outputted from the output terminal Q of the flip-flop circuit 51, and a precharge request signal is outputted from the output terminal Q of the flip-flop circuit 52.

If the row address and the column address are concurrently inputted to the normal MROM having the above construction, then the word line turn on recognition signal comes to have L-level and the address transition signal from ATD and the CE transition signal from ATD come to have H-level. Consequently, the word line turn on period recognition signal outputted from the bit line access period recognition circuit 28 (shown in FIG. 11) comes to have L-level. Then, the column selector control circuit 26 (shown in FIG. 9) decodes the inputted column addresses (CA4, CA5 and CA6). Only when the word line turn on period recognition signal outputted from the word line access period recognition circuit (shown in FIG. 10) comes to have H-level in the read operation, the desired column selection signal among the column selection signals Cselb0 through Cselbn and Cselv0 through Cselvn comes to have H-level, and the bit line and the virtual GND line corresponding to the H-level column selection signal is accessed (bit line sensing by the memory cells is started).

Next, upon the completion of the turn on of the word line, the word line turn on recognition signal comes to have H-level and the address transition signal from ATD and the CE transition signal from ATD come to have L-level, as a consequence of which the word line turn on period recognition signal outputted from the bit line access period recognition circuit 28 (shown in FIG. 11) comes to have L-level. Then, the word line turn on recognition signal inputted to the sense amplifier enabling circuit 24 (shown in FIG. 14) comes to have H-level, and the sense amplifier enable signal SAE comes to have H-level. Consequently, the sense amplifier 12 starts to amplify the node potential which maintains the potential between the bit line disconnecting circuit 11 (shown in FIG. 1) and the sense amplifier 12 (shown in FIG. 1) as well as the potential of the reference line. In this stage, the bit line sensing completion signal has L-level.

In this stage, the word line turn on period recognition signal has L-level, and therefore, the column selection signal that has selected the column selectors 3 and 5 of the column selector control circuit 26 (shown in FIG. 9) comes to have L-level, and the column selectors 3 and 5 that have been accessed are disabled. If the column selection signal comes to have L-level, then the normal precharge potential VREFn is supplied to the gate signal lines SG0 and SG1 of the VREF potential supply circuits 2 and 4 of the memory block that has been selected, precharging the bit line and the virtual GND line that have been selected.

Next, if the bit line sensing completion signal comes to have H-level, then the sense amplifier enable signal SAE of the sense amplifier enabling circuit 24 comes to have L-level, by which the bit lines BL0 through BLn and the virtual GND lines VG0 through VGn are disconnected from the sense amplifier 12 by the bit line disconnecting circuit 11 and the virtual GND line disconnecting circuit 13. Therefore, the precharge operation is also started by the VREF potential supply circuits 2 and 4 on the bit line and the virtual GND line that have been concurrently accessed, completing the bit line precharge operation by the time of read data output.

If the next column address CB is inputted after the read data output, then the bit line sensing is immediately started by the accessed memory cell on the bit line and the virtual GND line accessed by the column address CB concurrently with the turn on of the word line since the precharging of all the bit lines and all the virtual GND lines has been completed.

FIGS. 16A through 16H show a timing chart of the normal MROM. FIGS. 16A through 16H show a read operation to be executed on the memory blocks selected by the column addresses CA and CB.

In order to improve the access time of the normal MROM having a random access mode, the access of the bit line by the column address, i.e., the bit line sensing operation by the desired memory cell is executed (shown in FIGS. 16C and 16F) concurrently with the turn on of the word line (shown in FIG. 16B) by the row address when the precharge operation and the equalizing operation of the bit line and the virtual GND line have been completed at the time of column address (shown in FIG. 16A) input and chip enable signal CE input. That is, the bit line potential is lowered when the memory cell is the ON-state transistor, and the bit line maintains the precharge potential when the memory cell is the OFF-state transistor.

Therefore, the bit line sensing operation by the memory cell progresses at the turn on time of the word line in the read operation by the first column address CA. Therefore, after the completion of the turn on of the word line, the bit line amplifying operation is executed by the sense amplifier 12 on the basis of a sense amplifier enable A (shown in FIG. 16D), and the gate signal lines SG0 and SG1 come to have H-level. Consequently, the bit line and the virtual GND line are precharged again. Then, a data output A (shown in FIG. 16E) is outputted.

Likewise, the bit line sensing operation by the memory cell progresses at the turn on time of the word line in the read operation by the next column address CB. Therefore, after the completion of the turn on of the word line, the bit line amplifying operation is executed by the sense amplifier 12 on the basis of a sense amplifier enable B (shown in FIG. 16G), and the gate signal lines SG0 and SG1 come to have H-level. Consequently, the bit line and the virtual GND line are precharged again. Then, a data output B (shown in FIG. 16H) is outputted.

That is, the bit line precharging time and equalizing time as well as the bit line sensing operation time by the memory cell can be reduced by introducing the all-bit precharging system, allowing the access time speed to be increased.

As described above, by completing the precharge operation and the equalizing operation of all the bit lines at the time of address input and CE signal input utilizing the all-bit precharging system and maintaining the desired precharge potential, the access time speed can be increased, and this enables the provision of a novel mask ROM whose standby and operation current after the completion of the all-bit precharge operation is equivalent to that of the conventional mask ROM.

The bit line disconnecting circuit 11 shown in FIG. 12 enables the precharge operation of the bit line and the virtual GND line by disconnecting the bit line and the virtual GND line that have been connected to the sense amplifier 12 by means of the sense amplifier enable signal SAE concurrently with the latching of the sense amplifier output using the latch type sense amplifier as the sense amplifier 12.

Therefore, as shown in the timing chart of FIGS. 16A through 16H, the read data amplifying operation executed by the sense amplifier 12 and the precharge operation of the bit line and the virtual GND line that have been disconnected from the sense amplifier by the bit line disconnecting circuit 11 and the virtual GND line disconnecting circuit 13 can be executed parallel.

Next, as shown in FIG. 15, the access discriminating circuit 25 determines whether or not an access is currently made in a period that continues from the address input (the latch circuit of the preceding stage outputs H-level as a consequence of the operation that the address transition signal from ATD and the CE transition signal from ATD come to have H-level) to the read data output. If an access is currently made, the (device) access signal (H-level) is outputted. If the next address is inputted after the address input by the time of the read data output (the latch circuit of the subsequent stage outputs H-level as a consequence of the operation that the address transition signal from ATD and the CE transition signal from ATD come to have H-level), then the access discriminating circuit 25 outputs a precharge request signal (H-level). The bit line and virtual GND line that are accessed by the new address according to the precharge request signal are newly subjected to the precharge operation.

If the next address is inputted by the time of the completion of data output corresponding to the inputted address, then it is required to newly execute the precharge operation since the precharge operation has not yet been completed on the bit line and the virtual GND line that have been accessed until now. Only in this case, an extra precharge operation time is needed. Therefore, only when a new address is inputted during the read operation that continues from the address input to the data output, the next read operation requires an access time equivalent to that of the conventional case.

Although the normal mask ROM has been described as the semiconductor storage device in connection with the aforementioned embodiment, the present invention may also be applied to another semiconductor storage device such as a page mode MROM.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device having:

a plurality of memory cells arranged in a matrix form, word lines for activating the memory cells of an identical row of the plurality of memory cells, bit lines connected to one terminal of the memory cells of an identical column of the plurality of memory cells and virtual GND lines connected to the other terminal of the memory cells of an identical column of the plurality of memory cells, the semiconductor storage device comprising:

a sense amplifier that holds and amplifies a signal representing a potential difference between a potential of a reference line and a potential of the bit line connected to the column of selected memory cells upon completion of turn on of the word line in a read operation; and precharge potential supply circuits that supply a precharge potential to all the bit lines and the virtual GND lines at a power supply start time and supply a precharge potential to the bit line and virtual GND line of the column of the memory cells that have been selected, after completion of a period during which the bit line connected to the column of the selected memory cell is sensed by the memory cells in the read operation.

2. A semiconductor storage device as claimed in claim 1, comprising:

a disconnecting circuit that disconnects the bit lines and the reference line both connected to the sense amplifier from the sense amplifier during a period of an amplifying operation of the sense amplifier and disconnects the virtual GND lines connected to the ground potential from the sense amplifier during the period of the amplifying operation of the sense amplifier when the sense amplifier holds the signal representing the potential difference between the potential of the bit line and the potential of the reference line in the read operation.

3. A semiconductor storage device as claimed in claim 1, comprising:

an access discriminating circuit that recognizes the read operation being effected when an address is newly inputted in the read operation that continues from address input to data output and outputs to the precharge potential supply circuits a precharge request signal for supplying a precharge potential to the bit lines and the virtual GND lines.

4. A semiconductor storage device as claimed in claim 2, comprising:

an access discriminating circuit that recognizes the read operation being effected when an address is newly inputted in the read operation that continues from address input to data output and outputs to the precharge potential supply circuits a precharge request signal for supplying a precharge potential to the bit lines and the virtual GND lines.

5. A semiconductor storage device as claimed in claim 1, comprising:

a normal precharge potential generating circuit that forms the precharge potential to be supplied to the bit lines and the virtual GND lines;

a power-on stage precharge potential generating circuit that forms a power-on stage precharge potential to be supplied to the bit lines and the virtual GND lines in a turn on time slower than that of the normal precharge potential generating circuit; and a precharge potential changeover circuit that outputs the power-on stage precharge potential formed by the power-on stage precharge potential generating circuit to the precharge potential supply circuit in the power supply start stage and thereafter changes the precharge potential to the normal precharge potential formed by the normal precharge potential generating circuit and outputs the normal precharge potential to the precharge potential supply circuits upon recognizing that the precharging of all the bit lines and the virtual GND lines is completed via the precharge potential supply circuits with the power-on stage precharge potential.

6. A semiconductor storage device as claimed in claim 2, comprising:

a normal precharge potential generating circuit that forms the precharge potential to be supplied to the bit lines and the virtual GND lines;

a power-on stage precharge potential generating circuit that forms a power-on stage precharge potential to be supplied to the bit lines and the virtual GND lines in a turn on time slower than that of the normal precharge potential generating circuit; and a precharge potential changeover circuit that outputs the power-on stage precharge potential formed by the power-on stage precharge potential generating circuit to the precharge potential supply circuit in the power supply start stage and thereafter changes the precharge potential to the normal precharge potential formed by the normal precharge potential generating circuit and outputs the normal precharge potential to the precharge potential supply circuits upon recognizing that the precharging of all the bit lines and the virtual GND lines is completed via the precharge potential supply circuits with the power-on stage precharge potential.

7. A semiconductor storage device as claimed in claim 3, comprising:

a normal precharge potential generating circuit that forms the precharge potential to be supplied to the bit lines and the virtual GND lines;

a power-on stage precharge potential generating circuit that forms a power-on stage precharge potential to be supplied to the bit lines and the virtual GND lines in a turn on time slower than that of the normal precharge potential generating circuit; and a precharge potential changeover circuit that outputs the power-on stage precharge potential formed by the power-on stage precharge potential generating circuit to the precharge potential supply circuit in the power supply start stage and thereafter changes the precharge potential to the normal precharge potential formed by the normal precharge potential generating circuit and outputs the normal precharge potential to the precharge potential supply circuits upon recognizing that the precharging of all the bit lines and the virtual GND lines is completed via the precharge potential supply circuits with the power-on stage precharge potential.

8. A semiconductor storage device as claimed in claim 4, comprising:

a normal precharge potential generating circuit that forms the precharge potential to be supplied to the bit lines and the virtual GND lines;

a power-on stage precharge potential generating circuit that forms a power-on stage precharge potential to be supplied to the bit lines and the virtual GND lines in a turn on time slower than that of the normal precharge potential generating circuit; and a precharge potential changeover circuit that outputs the power-on stage precharge potential formed by the power-on stage precharge potential generating circuit to the precharge potential supply circuit in the power supply start stage and thereafter changes the precharge potential to the normal precharge potential formed by the normal precharge potential generating circuit and outputs the normal precharge potential to the precharge potential supply circuits upon recognizing that the precharging of all the bit lines and the virtual GND lines is completed via the precharge potential supply circuits with the power-on stage precharge potential.

\* \* \* \* \*